United States Patent
Liao et al.

(10) Patent No.: US 11,670,567 B2
(45) Date of Patent: Jun. 6, 2023

(54) SEMICONDUCTOR STRUCTURE AND METHOD OF WAFER BONDING

(71) Applicant: UNITED MICROELECTRONICS CORP., Hsin-Chu (TW)

(72) Inventors: Chia-Liang Liao, Yunlin County (TW); Purakh Raj Verma, Singapore (SG); Ching-Yang Wen, Pingtung County (TW); Chee Hau Ng, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 258 days.

(21) Appl. No.: 16/924,206

(22) Filed: Jul. 9, 2020

(65) Prior Publication Data

US 2022/0013430 A1   Jan. 13, 2022

(51) Int. Cl.
*H01L 23/373* (2006.01)
*H01L 21/48* (2006.01)
*H01L 23/15* (2006.01)

(52) U.S. Cl.
CPC ...... *H01L 23/3735* (2013.01); *H01L 21/4871* (2013.01); *H01L 23/15* (2013.01); *H01L 23/3736* (2013.01)

(58) Field of Classification Search
CPC ........... H01L 23/15; H01L 23/36–3738; H01L 23/3731
See application file for complete search history.

(56) References Cited

U.S. PATENT DOCUMENTS

| | | | |
|---|---|---|---|
| 9,966,301 B2 | 5/2018 | Howard | |
| 10,062,636 B2 | 8/2018 | Howard | |
| 11,264,493 B2* | 3/2022 | Morrow | H01L 23/147 |
| 2009/0039377 A1* | 2/2009 | Horio | H05K 1/0206 438/22 |
| 2010/0096718 A1* | 4/2010 | Hynecek | H01L 27/1464 257/460 |
| 2013/0334711 A1* | 12/2013 | Blackshear | G06F 30/20 257/E23.06 |
| 2014/0264739 A1* | 9/2014 | Morrow | H01L 24/18 257/532 |
| 2017/0110491 A1* | 4/2017 | Hekmatshoartabari | H01L 27/1262 |

(Continued)

FOREIGN PATENT DOCUMENTS

| | | | | |
|---|---|---|---|---|
| CN | 101295758 A | * | 10/2008 | H01L 33/0079 |
| CN | 102694082 A | * | 9/2012 | H01L 33/505 |

(Continued)

*Primary Examiner* — Michael Lebentritt
(74) *Attorney, Agent, or Firm* — Winston Hsu

(57) ABSTRACT

A semiconductor structure includes a glass substrate and a device wafer. The glass substrate includes a glass layer, a heat dissipation layer and a silicon nitride layer stacked from bottom to top. The device wafer includes at least one semiconductor device integrated in a device layer situated over the silicon nitride layer of the glass substrate. Or, the glass substrate includes a glass layer and a silicon nitride layer stacked from bottom to top. The device wafer includes at least one semiconductor device integrated in a device layer, and a heat dissipation layer is stacked on the device layer, wherein the heat dissipation layer is bonded with the silicon nitride layer of the glass substrate. The present invention also provides a method of wafer bonding for manufacturing said semiconductor structure.

20 Claims, 3 Drawing Sheets

(56) References Cited

U.S. PATENT DOCUMENTS

2020/0369561 A1\* 11/2020 Misra .................. C03C 17/3626
2021/0134698 A1\* 5/2021 Arrington ........... H01L 25/0655
2021/0375766 A1\* 12/2021 Tung .................. H01L 23/3736

FOREIGN PATENT DOCUMENTS

| CN | 207134352 U | \* | 3/2018 | |
|----|-------------|---|--------|---|
| TW | 202236526 A | \* | 9/2022 | ....... H01L 21/76843 |
| WO | WO-2015112574 A2 | \* | 7/2015 | ............. C01B 32/26 |

\* cited by examiner

SEMICONDUCTOR STRUCTURE AND METHOD OF WAFER BONDING

BACKGROUND OF THE INVENTION

1. Field of the Invention

The present invention relates generally to a semiconductor structure, and more specifically to a semiconductor structure applying wafer bonding.

2. Description of the Prior Art

In monolithic radio frequency circuits, heat generated by semiconductor devices integrated in semiconductor wafers may have deleterious effects on device performance. For example, heat generated by logic devices, such as complementary metal-oxide-semiconductor (CMOS) transistors, integrated in semiconductor wafers can results in degraded linearity and voltage imbalance across large branches of stacked transistors.

Accordingly, there is a need to overcome said problems in the art by eliminating heat integrated in semiconductor wafers and improve monolithic radio frequency circuits.

SUMMARY OF THE INVENTION

The present invention provides a semiconductor structure and a method of wafer bonding, which inserts a heat dissipation layer into a glass substrate or a device wafer, hence improving heat dissipating of the semiconductor structure.

The present invention provides a semiconductor structure including a glass substrate and a device wafer. The glass substrate includes a glass layer, a heat dissipation layer and a silicon nitride layer stacked from bottom to top. The device wafer includes at least one semiconductor device integrated in a device layer situated over the silicon nitride layer of the glass substrate.

The present invention provides a semiconductor structure including a glass substrate and a device wafer. The glass substrate includes a glass layer and a silicon nitride layer stacked from bottom to top. The device wafer includes at least one semiconductor device integrated in a device layer, and a heat dissipation layer is stacked on the device layer, wherein the heat dissipation layer is bonded with the silicon nitride layer of the glass substrate.

The present invention provides a method of wafer bonding including the following steps. A glass substrate including a glass layer and a silicon nitride layer stacked from bottom to top is provided. A device wafer including at least one semiconductor device integrated in a device layer is disposed on the silicon nitride layer of the glass substrate. A heat dissipation layer is directly formed on a side of the silicon nitride layer.

According to the above, the present invention provides a semiconductor structure and a method of wafer bonding, which provides a glass substrate including a glass layer and a silicon nitride layer stacked from bottom to top, disposes a device wafer including at least one semiconductor device integrated in a device layer on the silicon nitride layer of the glass substrate, forms a heat dissipation layer directly on a side of the silicon nitride layer. Thus, heat dissipating in the semiconductor structure can be improved. More precisely, the heat dissipation layer may be inserted between the glass layer and the silicon nitride layer of the glass substrate, or the heat dissipation layer may be disposed directly on the device layer of the device wafer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
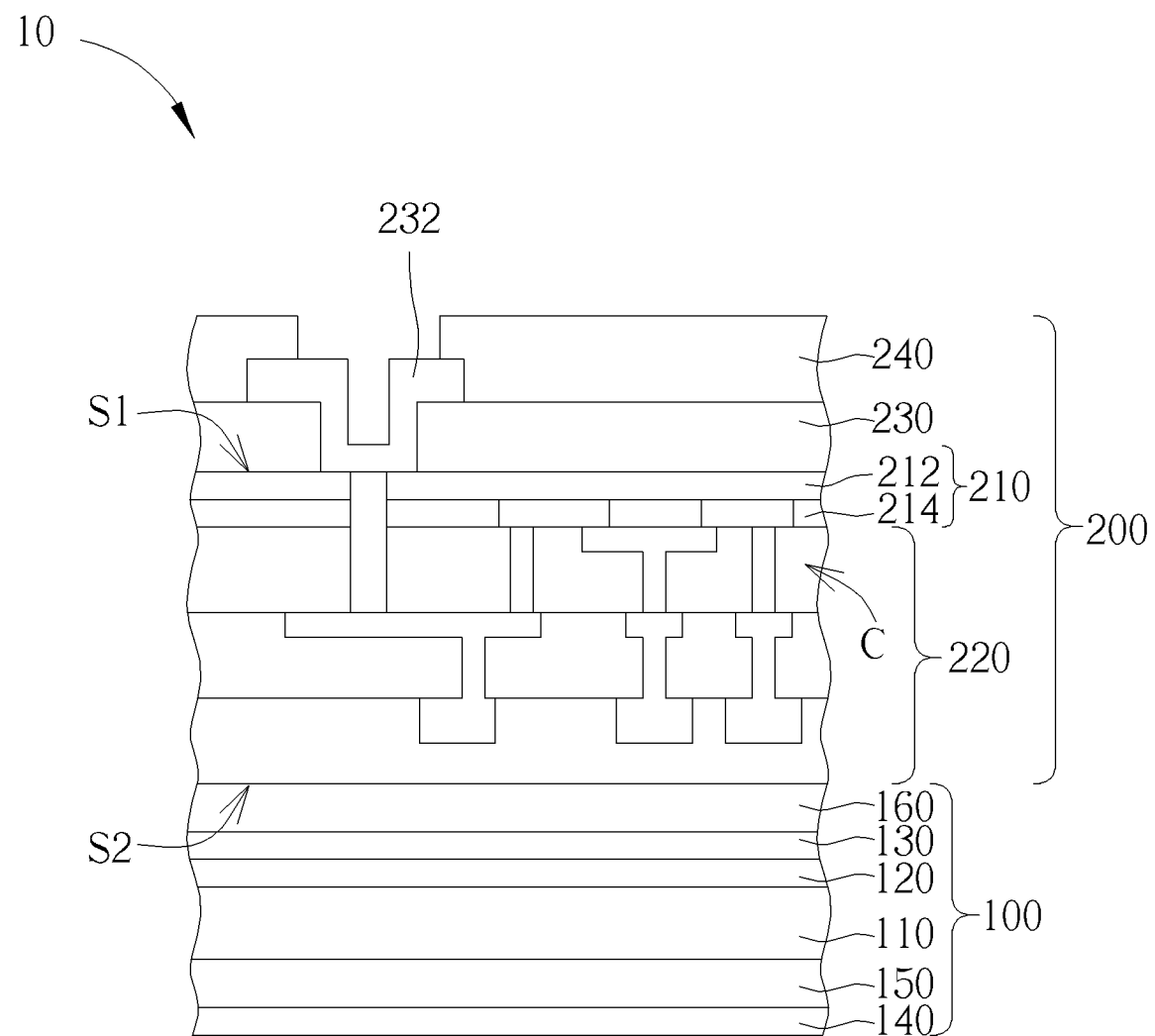
FIG. 1 schematically depicts a cross-sectional view of a semiconductor structure applying wafer bonding according to an embodiment of the present invention.

FIG. 1 schematically depicts a cross-sectional view of a semiconductor structure applying wafer bonding according to an embodiment of the present invention. As shown in FIG. 1, a glass substrate 100 is provided. The glass substrate 100 at least includes a glass layer 110, a heat dissipation layer 120 and a silicon nitride layer 130 stacked from bottom to top. In this embodiment, the glass substrate 100 includes a bottom silicon nitride layer 140, a titanium layer 150, the glass layer 110, the heat dissipation layer 120 and the silicon nitride layer 130 stacked from bottom to top, but it is not limited thereto. The heat dissipation layer 120 is used for heat dissipating, so that the heat dissipation layer 120 has a thermal conductivity higher than the thermal conductivity of glass. In a preferred embodiment, the heat dissipation layer 120 is an electrically isolated layer. In a still preferred embodiment, the heat dissipation layer 120 includes an aluminum nitride (AlN) layer, a silicon carbide (SiC) layer, an aluminum oxide ($Al_2O_3$) layer, a ceramic layer or a silicon nitride (SiN) based layer etc. Furthermore, an oxide cap layer 160 covers the silicon nitride layer 130 in this embodiment.

Moreover, a device wafer 200 is inverted and situated over the silicon nitride layer 130 of the glass substrate 100. The device wafer 200 may include a bulk substrate 210 and a device layer 220. The bulk substrate 210 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. In this case, the bulk substrate 210 is a silicon-on-insulator (SOI) substrate, wherein the bulk substrate 210 includes a buried oxide layer 212 and a top silicon layer 214), and a bottom silicon substrate of the silicon-on-insulator (SOI) substrate is removed after the device wafer 200 is disposed on and bonded with the silicon nitride layer 130 of the glass substrate 100). At least one semiconductor device C is integrated on the bulk substrate 210 and in the device layer 220. These semiconductor devices and forming methods are well known in the art, and are not described herein.

Then, a first oxide cap layer 230 and a passivation layer 240 may cover a backside S1 of the device layer 220 (or the bulk substrate 210) sequentially, and a pad 232 may be disposed in the passivation layer 240 and the first oxide cap layer 230 for electrically connecting the semiconductor device C outwards. The passivation layer 240 may be a nitride layer, and the first oxide cap layer 230 may be an oxide layer, but it is not limited thereto.

The oxide cap layer 160 of the glass substrate 100 is bonded with the device wafer 200 at a front side S2 of the device wafer 200.

Above all, due to the heat dissipation layer 120 being inserted in the glass substrate 100, the heat dissipation of a formed semiconductor structure 10 can be improved.

Figure 2:
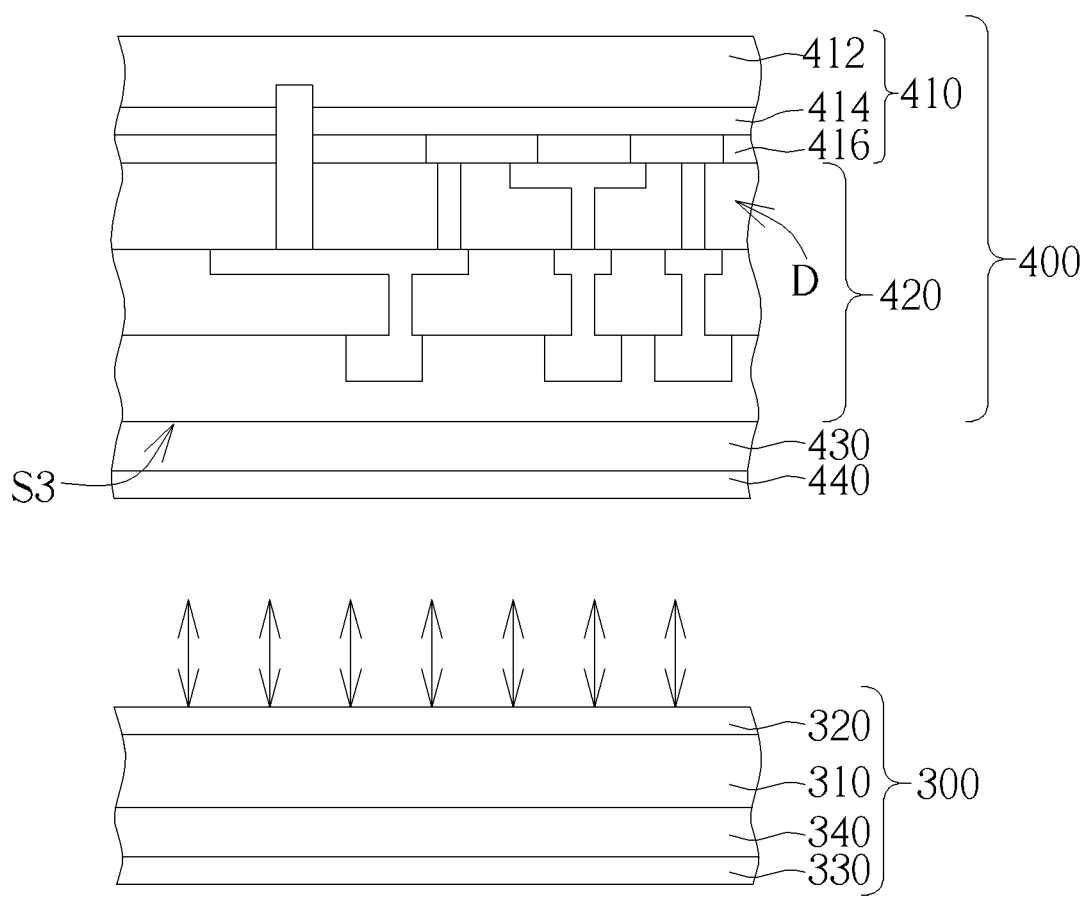
FIG. 2 schematically depicts a cross-sectional view of a method of wafer bonding according to an embodiment of the present invention.
Figure 3:
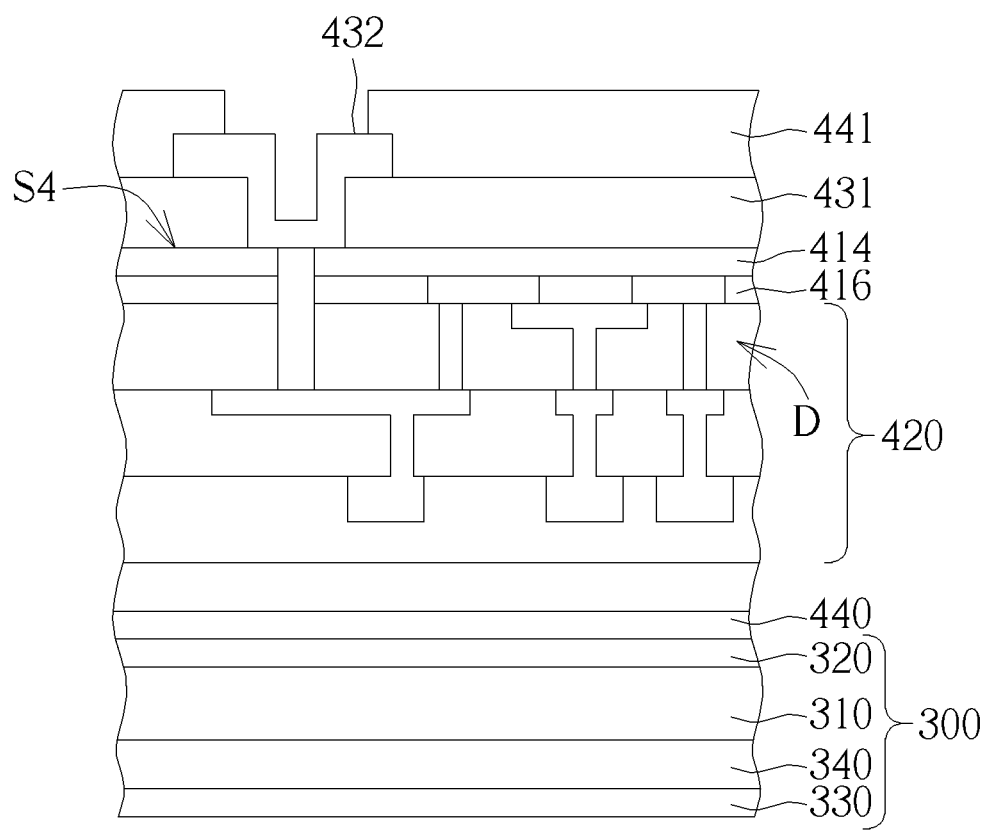
FIG. 3 schematically depicts a cross-sectional view of a method of wafer bonding according to an embodiment of the present invention.

Another embodiment is presented as follows. FIGS. 2-3 schematically depicts cross-sectional views of a method of wafer bonding according to an embodiment of the present invention. In this embodiment, a heat dissipation layer is stacked on a device layer of a device wafer, and the heat dissipation layer is bonded with a silicon nitride layer of a glass substrate. As shown in FIG. 2, a glass substrate 300 at least includes a glass layer 310 and a silicon nitride layer 320 stacked from bottom to top. In this embodiment, the glass substrate 300 further includes a bottom silicon nitride layer 330 and a titanium layer 340, wherein the bottom silicon nitride layer 330, the titanium layer 340, the glass layer 310 and the silicon nitride layer 320 are stacked from bottom to top, but it is not limited thereto.

A device wafer 400 is inverted and situated over the silicon nitride layer 320 of the glass substrate 300. The device wafer 400 may include a bulk substrate 410 and a device layer 420. The bulk substrate 410 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. In this case, the bulk substrate 410 is a silicon-on-insulator (SOI) substrate, wherein the bulk substrate 410 includes a bottom silicon substrate 412, a buried oxide layer 414 and a top silicon layer 416 stacked from bottom to top. At least one semiconductor device D is integrated on the bulk substrate 410 and in the device layer 420. These semiconductor devices D and forming methods are well known in the art, and are not described herein.

Furthermore, an oxide cap layer 430 covers a front side S3 of the device layer 420 in this embodiment. A heat dissipation layer 440 is stacked on the device layer 420 (or the oxide cap layer 430). The heat dissipation layer 440 is used for heat dissipating, so that the heat dissipation layer 440 has a thermal conductivity higher than the thermal conductivity of glass. In a preferred embodiment, the heat dissipation layer 440 is an electrically isolated layer. In a still preferred embodiment, the heat dissipation layer 440 includes an aluminum nitride (AlN) layer, a silicon carbide (SiC) layer, an aluminum oxide ($Al_2O_3$) layer, a ceramic layer or a silicon nitride (SiN) based layer etc.

As shown in FIGS. 2-3, the device wafer 400 is bonded with the silicon nitride layer 320 of the glass substrate 300. In this embodiment, the heat dissipation layer 440 is bonded with the silicon nitride layer 320 of the glass substrate 300. The bottom silicon substrate 412 of the bulk substrate 410 is removed after the device wafer 400 is disposed on the silicon nitride layer 320 of the glass substrate 300.

Then, a first oxide cap layer 431 and a passivation layer 441 may cover a backside S4 of the device layer 420 (or buried oxide layer 414) sequentially, and a pad 432 may be disposed in the passivation layer 441 and the first oxide cap layer 431 for electrically connecting the semiconductor device D outwards. The passivation layer 441 may be a nitride layer, and the first oxide cap layer 431 may be an oxide layer, but it is not limited thereto.

To summarize, the present invention provides a semiconductor structure and a method of wafer bonding, which provides a glass substrate including a glass layer and a silicon nitride layer stacked from bottom to top, disposes a device wafer including at least one semiconductor device integrated in a device layer on the silicon nitride layer of the glass substrate, forms a heat dissipation layer directly on a side of the silicon nitride layer. Thus, heat dissipating in the semiconductor structure can be improved. More precisely, the heat dissipation layer may be inserted between the glass layer and the silicon nitride layer of the glass substrate, or the heat dissipation layer may be disposed directly on the device layer of the device wafer, depending upon practical requirements.

Moreover, the heat dissipation layer has a thermal conductivity higher than the thermal conductivity of glass for improving the heat dissipation of the glass substrate. Preferably, the heat dissipation layer is an electrically isolated layer for keeping electrically isolated. Still preferably, the heat dissipation layer includes an aluminum nitride (AlN) layer, a silicon carbide (SiC) layer, an aluminum oxide ($Al_2O_3$) layer, a ceramic layer or a silicon nitride (SiN) based layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a glass substrate comprising a glass layer, a heat dissipation layer and a silicon nitride layer stacked from bottom to top; and
    a device wafer comprising at least one semiconductor device integrated in a device layer situated over the silicon nitride layer of the glass substrate, wherein an entire surface of the device wafer is bonded with an entire surface of the silicon nitride layer.

2. The semiconductor structure according to claim 1, wherein the glass substrate comprises a bottom silicon nitride layer, a titanium layer, the glass layer, the heat dissipation layer and the silicon nitride layer stacked from bottom to top.

3. The semiconductor structure according to claim 1, wherein the heat dissipation layer has a thermal conductivity higher than the thermal conductivity of glass.

4. The semiconductor structure according to claim 1, wherein the heat dissipation layer is an electrically isolated layer.

5. The semiconductor structure according to claim 4, wherein the heat dissipation layer comprises an aluminum nitride (AlN) layer, a silicon carbide (SiC) layer, an aluminum oxide ($Al_2O_3$) layer, a ceramic layer or a silicon nitride (SiN) based layer.

6. The semiconductor structure according to claim 1, further comprising:
    a first oxide cap layer and a passivation layer covering a backside of the device layer sequentially.

7. The semiconductor structure according to claim 1, further comprising:
    an oxide cap layer covering the silicon nitride layer of the glass substrate, wherein the oxide cap layer is bonded with the device wafer.

8. A semiconductor structure, comprising:
    a glass substrate comprising a glass layer and a silicon nitride layer stacked from bottom to top; and a device wafer comprising at least one semiconductor device integrated in a device layer, and a heat dissipation layer stacked on an entire surface of the device layer, wherein an entire surface of the heat dissipation layer is bonded with an entire surface of the silicon nitride layer of the glass substrate.

9. The semiconductor structure according to claim 8, wherein the glass substrate comprises a bottom silicon nitride layer, a titanium layer, the glass layer and the silicon nitride layer stacked from bottom to top.

10. The semiconductor structure according to claim 8, wherein the heat dissipation layer has a thermal conductivity higher than the thermal conductivity of glass.

11. The semiconductor structure according to claim 10, wherein the heat dissipation layer is an electrically isolated layer, and the heat dissipation layer comprises an aluminum nitride (AlN) layer, a silicon carbide (SiC) layer, an aluminum oxide ($Al_2O_3$) layer, a ceramic layer or a silicon nitride (SiN) based layer.

12. The semiconductor structure according to claim 8, further comprising:
an oxide cap layer and a passivation layer covering the device layer sequentially.

13. The semiconductor structure according to claim 12, wherein the heat dissipation layer is bonded with the oxide cap layer.

14. A method of wafer bonding, comprising:
providing a glass substrate comprising a glass layer and a silicon nitride layer stacked from bottom to top;
disposing a device wafer comprising at least one semiconductor device integrated in a device layer on the silicon nitride layer of the glass substrate, wherein an entire surface of the device wafer is disposed on an entire surface of the silicon nitride layer; and
forming a heat dissipation layer directly on a side of the silicon nitride layer.

15. The method of wafer bonding according to claim 14, wherein the heat dissipation layer is directly formed on the glass layer, and then the silicon nitride layer is directly formed on the heat dissipation layer.

16. The method of wafer bonding according to claim 14, further comprising:
forming an oxide cap layer on the silicon nitride layer of the glass substrate.

17. The method of wafer bonding according to claim 16, wherein the oxide cap layer of the glass substrate is bonded with the device wafer.

18. The method of wafer bonding according to claim 14, wherein the heat dissipation layer is formed on the device layer, and then the device wafer is disposed on and bonded with the silicon nitride layer of the glass substrate.

19. The method of wafer bonding according to claim 14, wherein the heat dissipation layer has a thermal conductivity higher than the thermal conductivity of glass.

20. The method of wafer bonding according to claim 19, wherein the heat dissipation layer is an electrically isolated layer, wherein the heat dissipation layer comprises an aluminum nitride (AlN) layer, a silicon carbide (SiC) layer, an aluminum oxide ($Al_2O_3$) layer, a ceramic layer or a silicon nitride (SiN) based layer.

* * * * *